US008801879B2

(12) United States Patent
Tamaki

(10) Patent No.: US 8,801,879 B2
(45) Date of Patent: Aug. 12, 2014

(54) METHOD FOR MANUFACTURING MULTILAYER FILM

(75) Inventor: Tsuyoshi Tamaki, Hitachi (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 234 days.

(21) Appl. No.: 12/306,283

(22) PCT Filed: Apr. 18, 2008

(86) PCT No.: PCT/JP2008/057606
§ 371 (c)(1),
(2), (4) Date: Dec. 23, 2008

(87) PCT Pub. No.: WO2008/136284
PCT Pub. Date: Nov. 13, 2008

(65) Prior Publication Data
US 2009/0236026 A1    Sep. 24, 2009

(30) Foreign Application Priority Data

Apr. 26, 2007  (JP) ................................ 2007-117423

(51) Int. Cl.
*B32B 38/00* (2006.01)
(52) U.S. Cl.
USPC ............. 156/60; 156/152; 156/163; 156/166; 156/176; 156/247; 156/248; 156/250; 156/252; 156/254; 156/269; 156/270; 156/344; 156/395; 156/537
(58) Field of Classification Search
USPC ........... 156/60, 152, 163, 166, 176, 247, 248, 156/250, 252, 254, 269, 270, 344, 395, 537
See application file for complete search history.

(56) References Cited

U.S. PATENT DOCUMENTS

| 4,475,969 | A | 10/1984 | Reed |
| 6,357,503 | B1 * | 3/2002 | Kromer et al. ................ 156/351 |
| 6,451,154 | B1 * | 9/2002 | Grabau et al. ................ 156/300 |

(Continued)

FOREIGN PATENT DOCUMENTS

| EP | 2002-52629 | 2/2002 |
| JP | 55-19276 | 2/1980 |

(Continued)

OTHER PUBLICATIONS

International Preliminary Report on Patentability dated Nov. 19, 2009.

(Continued)

*Primary Examiner* — Katarzyna Wyrozebski Lee
*Assistant Examiner* — Joshel Rivera
(74) *Attorney, Agent, or Firm* — Antonelli, Terry, Stout & Kraus, LLP.

(57) ABSTRACT

A process for production of a multilayer film that comprises a step in which an adhesive layer formed on a temporary base is situated along the lengthwise direction of the temporary base at a prescribed spacing and cut in such a manner that the plurality of sections which are to serve as adhesive films are partitioned from the other sections, and a step in which the adhesive films on the temporary base are moved onto a support film at a prescribed spacing along the lengthwise direction of the support film. The spacing between the adjacent adhesive films on the temporary base is different from the spacing between the adjacent adhesive films on the support film.

9 Claims, 8 Drawing Sheets

(56) References Cited

U.S. PATENT DOCUMENTS

| | | |
|---|---|---|
| 7,051,428 B2 | 5/2006 | Jeong et al. |
| 2006/0151087 A1 | 7/2006 | Mizuta |
| 2006/0154066 A1 | 7/2006 | Kita et al. |

FOREIGN PATENT DOCUMENTS

| | | |
|---|---|---|
| JP | 59-091176 | 5/1984 |
| JP | 04-057871 | 2/1992 |
| JP | 2004-221336 | 8/2004 |
| JP | 2005-162818 | 6/2005 |
| JP | 2006-240302 | 9/2006 |
| KR | 10-2002-0081332 A | 10/2002 |
| TW | 200504230 | 2/2005 |

OTHER PUBLICATIONS

Official Communication dated Nov. 23, 2011 for Application No. 10-2008-7026898; 2 pages; Korean Patent Office, The Republic of Korea.

Search Report issued on Feb. 1, 2012 in counterpart European application No. 08 74 0661; 8 pages.

"DATABASE WPI Week 200310", Thomson Scientific, p. 1, London, GB; AN 2003-105900, XP002667524.

Communication mailed Jun. 3 2013, in connection with Taiwanese Patent Application No. 097115050, 6 pages; Taiwan Patent Office, Taiwan.

* cited by examiner

METHOD FOR MANUFACTURING MULTILAYER FILM

TECHNICAL FIELD

The present invention relates to a process for production of a multilayer film having a plurality of adhesive films formed on a support film, and for production of a multilayer film having a plurality of adhesive films and a pressure-sensitive adhesive film formed on a support film.

BACKGROUND ART

Multilayer films having a plurality of adhesive films and a pressure-sensitive adhesive film formed on a support film include, for example, die bonding-dicing integrated films wherein a die bonding adhesive layer and a dicing pressure-sensitive adhesive layer are formed on a support film.

Such multilayer films may be produced, for example, by a method in which a die bonding film comprising a support film and adhesive layers formed on the support film and separated at a prescribed spacing is laminated with a dicing film comprising a base film and pressure-sensitive adhesive layers formed on the base film, with the adhesive layers and the pressure-sensitive adhesive layers facing inward (Patent document 1).
[Patent document 1] Japanese Unexamined Patent Publication No. 2004-221336

DISCLOSURE OF THE INVENTION

Problem to be Solved by the Invention

A plurality of adhesive layers situated at a prescribed spacing can be formed by a method in which first an adhesive layer is formed to cover the entirety of one side of the support film, after which the unneeded sections are removed leaving only portions thereof, and for industrial purposes this method is preferably employed from the viewpoint of production efficiency.

When multilayer films are produced by conventional methods, however, it is necessary to form the adhesive film on the support film while creating the spacing that is required for the final product, and this results in large amounts of unneeded portions of the adhesive layer that must be discarded. Particularly when expensive materials are used for die bonding adhesive films, it is highly desirable from an industrial point of view to minimize the amounts of unneeded portions that are to be discarded.

Another problem with production of multilayer films by conventional methods is that the adhesive film must be cut on the support film, and this results in cuts being created in the surface of the support film around the outer periphery of the adhesive film as the adhesive film is cut. The introduction of cuts invites contaminants such as film dust to collect at those sections, and therefore it is highly desirable to avoid such cuts.

It is an object of the present invention to provide a process for production of a multilayer film comprising a plurality of adhesive films formed on a support film, wherein the plurality of adhesive films can be efficiently formed at any desired predetermined spacing which may be different from the spacing in the final product, or even without spacing, and whereby cuts in the surface of the support film can be avoided.

Means for Solving the Problem

The present invention relates to a process for production of a multilayer film comprising a support film and a plurality of adhesive films situated on the support film along the lengthwise direction of the support film. The production process of the invention comprises a step (A) in which an adhesive layer formed on a temporary base is situated along the lengthwise direction of the temporary base either at a prescribed spacing or without spacing, and cut in such a manner as to partition the plurality of sections which are to serve as adhesive films from the other sections, and a step (B) in which the adhesive films on the temporary base are moved onto the support film at a prescribed spacing along the lengthwise direction of the support film. While the plurality of sections which are to serve as adhesive films are situated along the lengthwise direction of the temporary base at the prescribed spacing, the spacing between adjacent adhesive films on the temporary base differs from the spacing between the adjacent adhesive films on the support film.

According to the production process of the invention, a plurality of adhesive films for the multilayer film are first formed on the temporary base, after which the formed adhesive films are moved onto the support film. It is therefore possible to form the adhesive films in such a manner that they are situated at any desired predetermined spacing different from the spacing in the final product, or without spacing.

Also, since the adhesive layer is cut on the temporary base and the formed adhesive films are subsequently moved onto the support film in the production process of the invention, it is possible to avoid cuts in the support film surface.

The production process of the invention may further comprise a step (C) in which all or some of the non-adhesive-film sections of the adhesive layer on the temporary base are removed to leave the adhesive films on the temporary base, as a step between step (A) and step (B). This will make it easier for the adhesive film on the temporary base to be moved onto the support film.

When the plurality of sections which are to serve as adhesive films are situated along the lengthwise direction of the temporary base at the prescribed spacing, the spacing between adjacent adhesive films on the temporary base is preferably narrower than the spacing between the adjacent adhesive films on the support film. This will form the adhesive films on the temporary base at a high density, with a narrower spacing than the spacing required for the final product. This can reduce the amount of adhesive layer that must be removed as unneeded sections.

The multilayer film may further be provided with a pressure-sensitive adhesive film having an overhanging section extending from the outer periphery of the adhesive film, which is formed on the adhesive film. In this case, the production process of the invention preferably further comprises a step (a) wherein the adhesive film and pressure-sensitive adhesive layers are attached, a step (b) wherein the pressure-sensitive adhesive layer on the adhesive film is cut so as to partition the plurality of sections which are to serve as pressure-sensitive adhesive films from the other sections, and a step (c) wherein all or some of the sections of the non-pressure-sensitive-adhesive-film sections of the pressure-sensitive adhesive layer are removed, leaving the pressure-sensitive adhesive films on the adhesive film.

For example, by attaching the adhesive films and the pressure-sensitive adhesive layer, the plurality of adhesive films on the temporary base may be moved onto the pressure-sensitive adhesive layer at a prescribed spacing that is different from the spacing between the adjacent adhesive films on the temporary base, along the lengthwise direction of the pressure-sensitive adhesive layer, and then the adhesive films and support film may be attached to the pressure-sensitive adhesive layer to move them onto the support film at a prescribed spacing along the lengthwise direction of the support film while the plurality of adhesive films are still attached to the pressure-sensitive adhesive layer. In this case, step (a) will be included in step (B), and steps (b) and (c) will be carried out after step (B). As another example, the adhesive films moved onto the support film in step (B) may be attached to the pressure-sensitive adhesive layer while still attached to the support film. In this case, steps (a), (b) and (c) will be carried out after step (B).

With a multilayer film comprising the aforementioned pressure-sensitive adhesive film, it is necessary to significantly increase the spacing between adhesive films in order to ensure space for the overhanging sections of the pressure-sensitive adhesive film, but the amount of adhesive layer that must be removed as unneeded sections can still be minimized in such cases according to the invention.

In step (c), the pressure-sensitive adhesive layer is preferably cut in such a manner that the plurality of sections that are to serve as the pressure-sensitive adhesive films are partitioned from the sections surrounding those sections as well as the other sections, and the sections of the pressure-sensitive adhesive layer surrounding the plurality of pressure-sensitive adhesive films are preferably removed leaving the pressure-sensitive adhesive films on the adhesive film. In this case, the exposed sections of the support film are formed around the pressure-sensitive adhesive film in the multilayer film. This improves the handleability of the multilayer film, facilitating release from the support film when using a laminated body comprising the adhesive films and pressure-sensitive adhesive film.

In the production process of the invention, the adhesive films may be die bonding adhesive films and the pressure-sensitive adhesive films may be dicing pressure-sensitive adhesive films.

The production process of the invention may further comprise a step wherein the outer appearance of the adhesive film on the temporary base is inspected. This can help prevent defective final products, if the only products moved onto the support film are those among the plurality of adhesive films on the temporary base that are judged as satisfactory in the step in which the outer appearance of the adhesive film is inspected.

Effect of the Invention

By producing a multilayer film having a plurality of adhesive films formed on a support film according to the invention, it is possible to efficiently form the plurality of adhesive films with any desired predetermined spacing that is different from the spacing in the final product, or without spacing. As a result, reduced waste and lower production cost are achieved since the amount of adhesive layer to be removed as unneeded sections can be minimized. Also according to the invention, it is possible to avoid cuts in the support film surface and prevent residue of contaminants such as film dust caused as a result.

EXPLANATIONS OF NUMERALS

Figure 1:
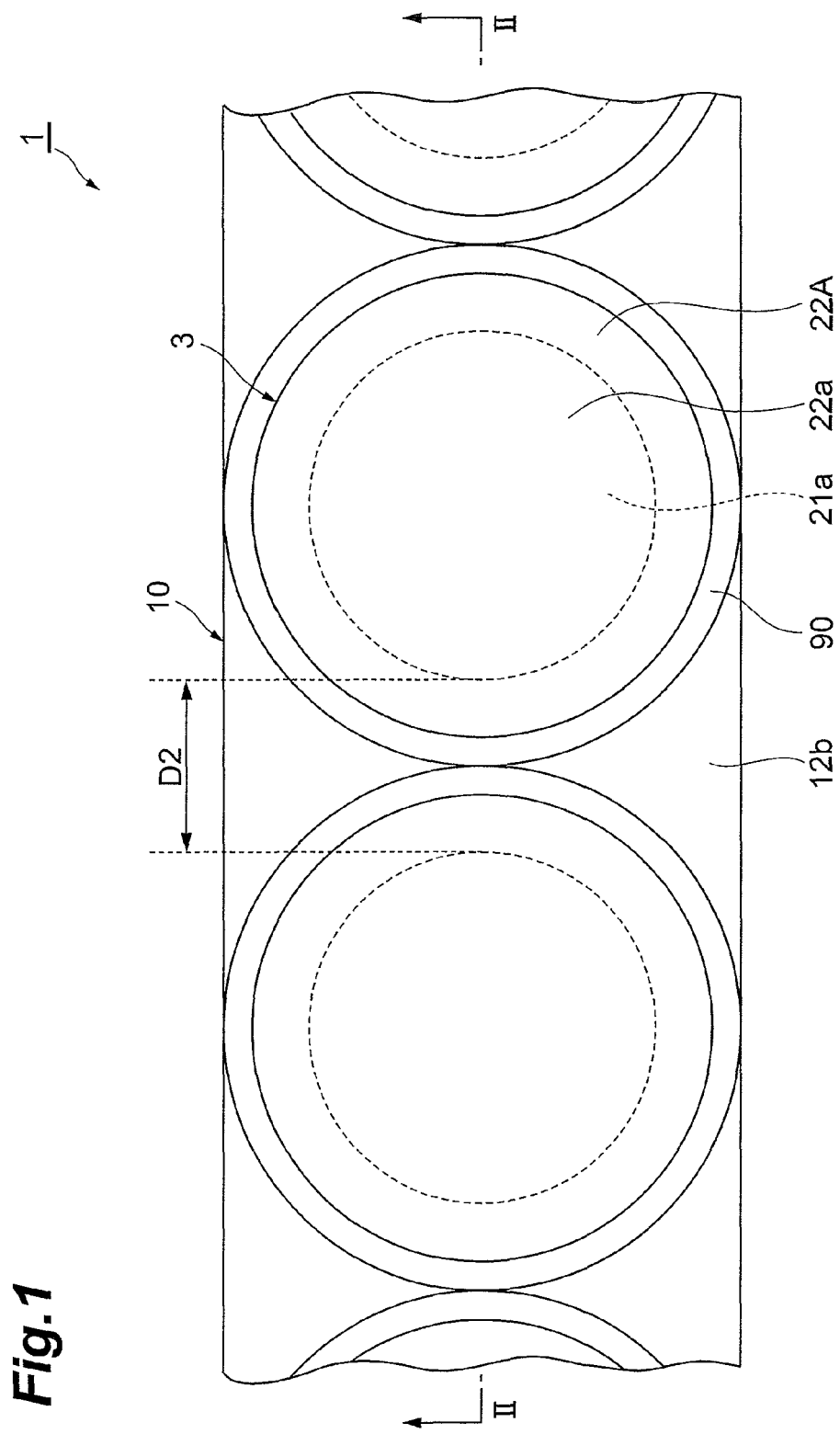
FIG. 1 is a plan view showing an embodiment of a multilayer film.

1: Multilayer film, 3: laminated body (die bonding-dicing integrated film), 5: semiconductor wafer, 7: ring frame, 9: dicing film, 10: support film, 11: temporary base, 12: base film, 13: cover film, 21: adhesive layer, 21a: adhesive film, 22: pressure-sensitive adhesive layer, 22A: overhanging section, 22a: pressure-sensitive adhesive film, 31,32: cutters, 40: release sheet, 50,51: adsorption pad, 80: inspecting device, 90: exposed section.

BEST MODES FOR CARRYING OUT THE INVENTION

Preferred embodiments of the invention will now be explained in detail, with reference to the accompanying drawing as necessary. Throughout the drawings, elements with identical or corresponding structures in the drawings will be referred to by like reference numerals, and where appropriate they will be explained only once.

Figure 2:
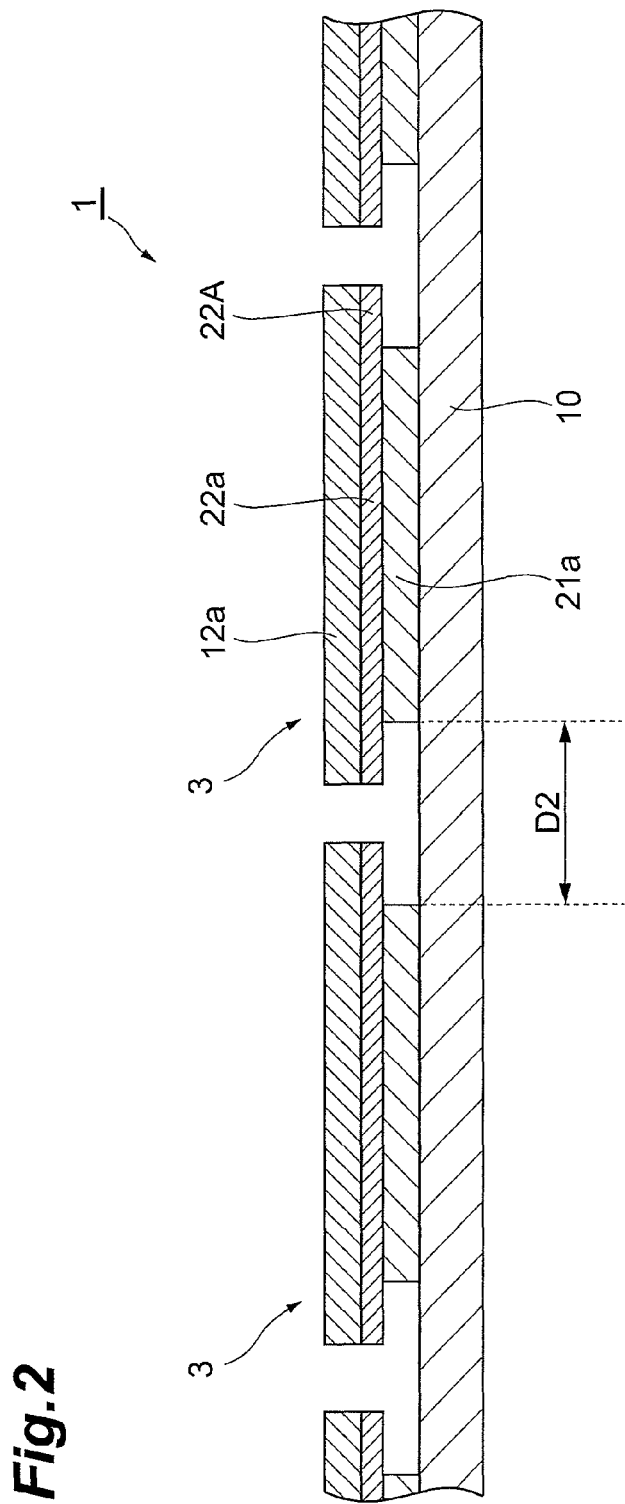
FIG. 2 is an end view of FIG. 1 along line II-II.

FIG. 1 is a plan view showing an embodiment of a multilayer film, and FIG. 2 is an end view of FIG. 1 along line II-II. The multilayer film 1 shown in FIGS. 1 and 2 is composed of a long support film 10, a plurality of adhesive films 21a having circular main sides, pressure-sensitive adhesive films 22a laminated on the sides of the plurality of adhesive films 21a opposite the respective support film 10 sides, and a base film 12a covering the pressure-sensitive adhesive films 22a.

The adhesive films 21a are situated on the support film 10 at a prescribed spacing D2 along the lengthwise direction of the support film 10. Each of the adhesive films 21a is a die bonding adhesive film used for bonding of semiconductor elements to semiconductor element mounting boards. The pressure-sensitive adhesive films 22a and base films 12a have circular main sides with larger areas than the main sides of the adhesive films 21a, and each of the pressure-sensitive adhesive films 22a has a ring-shaped overhanging section 22A that extends out from the outer periphery of the main side of each adhesive film 21a. Each of the pressure-sensitive adhesive films 22a is a dicing pressure-sensitive adhesive film used for anchoring of semiconductor wafers during individuation of semiconductor wafers by dicing.

The laminated body 3 having a laminated structure with the adhesive film 21a, pressure-sensitive adhesive film 22a and base film 12a laminated in that order is released from the support film 10 and used as a die bonding-dicing integrated film functioning both for die bonding and dicing. In order to facilitate release of the laminated body 3, a ring-shaped exposed section 90 is formed to expose the support film 10 around the perimeter of the laminated body 3. A portion of the pressure-sensitive adhesive layer 22b and the base film 12b are laminated on the support film 10 at the areas further outward from the exposed section 90. The overhanging section 22A of each pressure-sensitive adhesive film 22a is shown to be at a distance from the support film 10 in the drawing only to facilitate explanation, as the overhanging section 22A will normally also be partially in contact with the support film 10.

Figure 3:
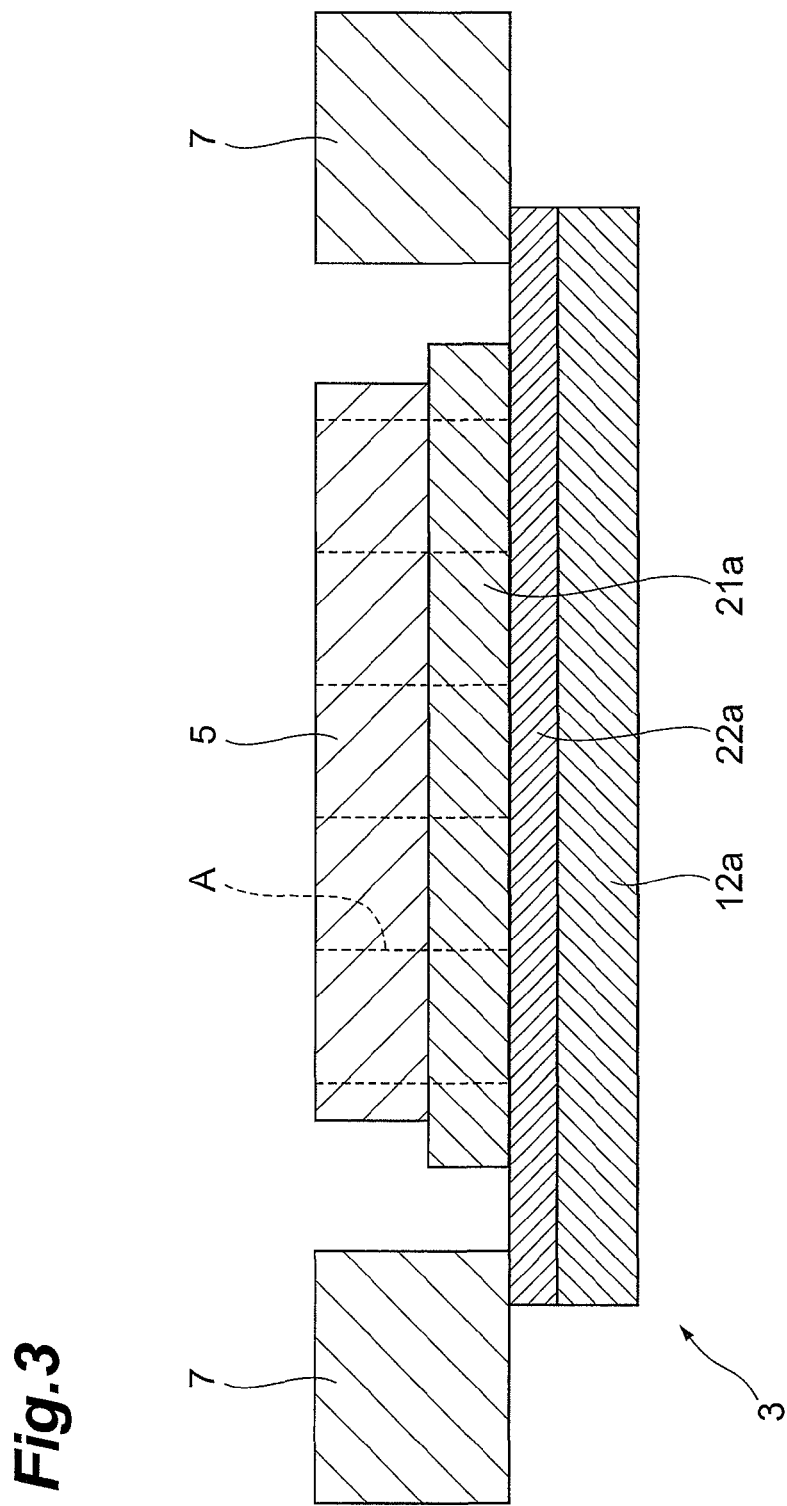
FIG. 3 is an end view showing the step of dicing a semiconductor wafer.

FIG. 3 is an end view showing an embodiment of a step of dicing a semiconductor wafer using the laminated body (die bonding-dicing integrated film) 3. Each adhesive film 21a is attached to the semiconductor wafer 5, while the overhanging section 22A of each pressure-sensitive adhesive film 22a is attached to a ring frame 7 provided surrounding the perimeter of the semiconductor wafer 5. The die bonding-dicing integrated film 3 is anchored to the ring frame 7 by the pressure-sensitive adhesive force of the overhanging sections 22A. The semiconductor wafer 5 is diced into a lattice together with the adhesive films 21a, along the lines A in the drawing. After dicing, the pressure-sensitive adhesive force of the pressure-sensitive adhesive films 22a is reduced by light irradiation if necessary, and is picked up together with adhesive films 21a to one side of which the individuated semiconductor wafer (semiconductor chip) is attached. The picked-up semiconductor chip is bonded to the semiconductor-mounting board via the adhesive films 21a.

Figure 4:
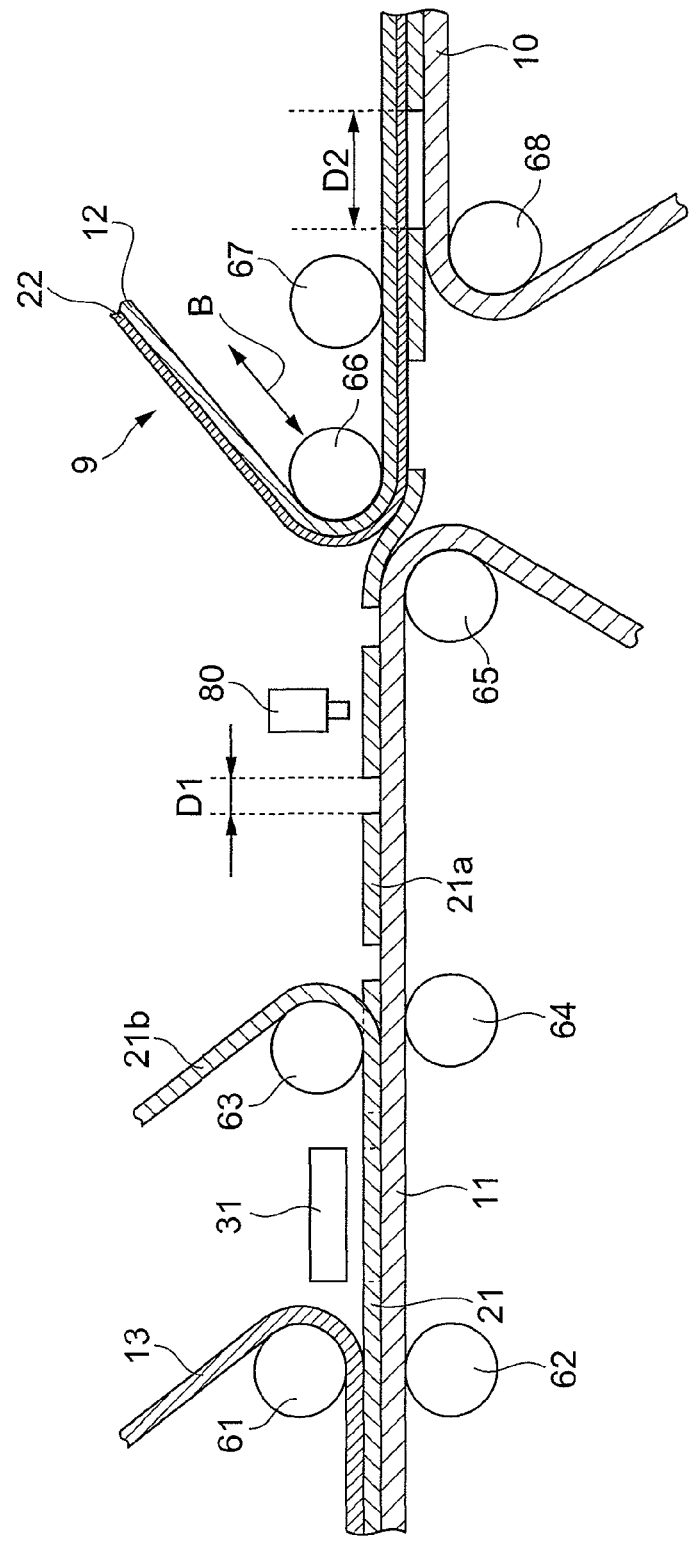
FIG. 4 is a schematic drawing showing an embodiment of a process for production of a multilayer film.
Figure 5:
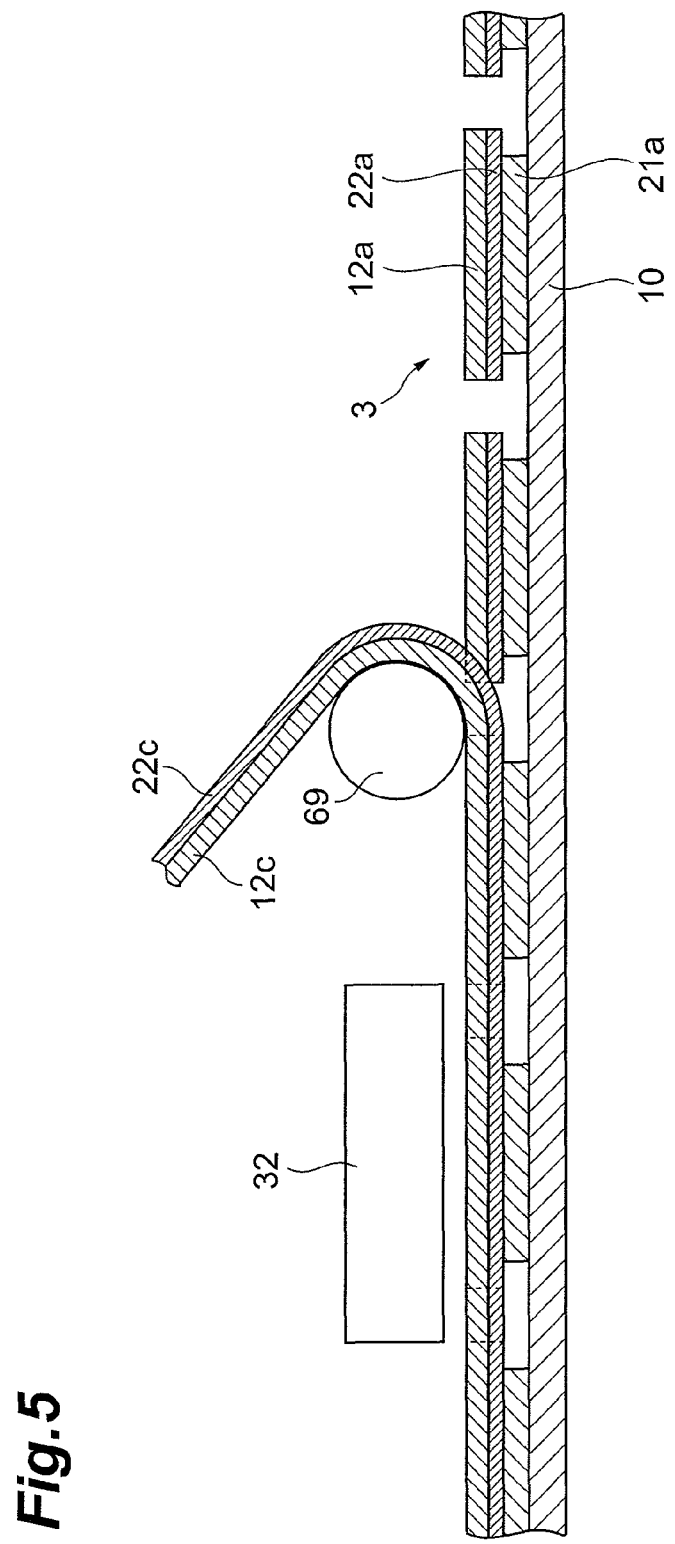
FIG. 5 is a schematic drawing showing an embodiment of a process for production of a multilayer film.

FIGS. 4 and 5 are schematic drawings for an embodiment of a process for production of the multilayer film 1. The production process for the embodiment shown in FIG. 4 comprises a step in which the adhesive layer 21 formed to cover the entirety of one side of the temporary base 11 is cut in such a manner as to be partitioned into a plurality of sections that are to serve as the adhesive films 21a situated along the lengthwise direction of the temporary base 11 with a prescribed spacing D1 between them, and the sections other than those sections, a step in which the sections of the adhesive layer 21 other than the adhesive films 21a on the temporary base 11 are removed, a step in which the adhesive films 21a on the temporary base 11 are moved onto the pressure-sensitive adhesive layer 22 along the lengthwise direction of the pressure-sensitive adhesive layer 22 with a spacing D2 between them, and a step in which the support film 10 is attached onto the adhesive films 21a that have been moved onto the pressure-sensitive adhesive layer 22. The spacing D1 between the adjacent adhesive films 21a on the temporary base 11 is narrower than the spacing D2 between the adjacent adhesive films 21a on the support film 10. The production process for the embodiment shown in FIG. 5 comprises a step in which the pressure-sensitive adhesive layer 22 and base film 12 on the adhesive films 21a are further cut in such a manner that the pressure-sensitive adhesive layer 22 is partitioned into a plurality of sections that are to serve as the pressure-sensitive adhesive films 22a, ring-shaped sections 22c surrounding those sections, and sections other than those sections, and a step in which the ring-shaped sections 22c of the pressure-sensitive adhesive layer 22 are removed together with the sections of the base film 12c on the ring-shaped sections 22c.

The adhesive layer 21 is formed on the temporary base 11, for example, by a method in which an adhesive solution containing the adhesive and a solvent dissolving or dispersing the adhesive is coated onto the temporary base 11, and the solvent is then removed from the coated adhesive solution. A resin film is preferably used as the temporary base 11, and it is preferably a polyethylene terephthalate film that has been release-treated with a silicone-based release agent. The adhesive layer 21 is preferably supplied in a form covered with a cover film 13.

After the cover film 13 has traveled over the peripheral surface of a roll 61 to release it from the adhesive layer 21, the adhesive layer 21 is cut into a circle using a cutter 31 having a circular blade. Only the adhesive layer 21 is cut at this time, avoiding cutting the entire temporary base 11. Sections 21b of the adhesive layer, as sections other than the circular sections left as adhesive films 21a, are removed around the peripheral surface of a roll 63 provided downstream from the cutter 31. After removing the sections 21b of the adhesive layer, the adhesive films 21a are left on the temporary base 11, situated at a prescribed spacing D1.

The spacing D1 may be set as desired, without any dependence on the spacing D2 between the adjacent adhesive films 21a on the multilayer film 1 as the final product. For this embodiment, the spacing D1 is set to be smaller than the spacing D2.

Forming the adhesive films 21a at high density with a smaller spacing D1 significantly reduces the amount of the sections 21b of the adhesive layer that must be removed as the unneeded sections. Adhesives used for die bonding as in this embodiment are particularly expensive, and therefore a notable advantage is provided by reducing the amount of unneeded sections. In order to guarantee space for the overhanging section 22A to be used for attachment onto a ring frame during dicing as described above, it is necessary to create a relatively large spacing D2 between the adhesive films 21a on the multilayer film 1, and therefore the advantage provided by the present invention is notable.

Preferably, the spacing D1 (the minimum distance between adjacent adhesive films) is set within a range of 0-60 mm. The adjacent adhesive films 21a on the temporary base 11 may also be situated without a spacing, i.e. with a spacing D1=0. If the spacing D1 is larger than this range, the amount of the sections 21b of the adhesive layer that are removed as unneeded sections will increase, thus reducing the effect of the invention.

The spacing D2 may be adjusted irrespective of the spacing D1, and different spacings D2 may also differ from each other.

In the embodiments illustrated in FIGS. 4 and 5, the step in which the adhesive films 21a are moved onto the support film 10 is carried out in a simultaneous progressive manner with the step of attaching the adhesive films 21a to the pressure-sensitive adhesive layer 22. The adhesive films 21a are transferred from the temporary base 11 onto the pressure-sensitive adhesive layer 22, and the support film 10 is attached onto the adhesive films 21a on the pressure-sensitive adhesive layer 22. As a result of this continuous process, the adhesive films 21a are moved from the temporary base 11 onto the support film 10. The adhesive films 21a may be attached onto the support film 10 and pressure-sensitive adhesive layer 22 in either order, and both attachments may even be carried out simultaneously. Specifically, for example, instead of first attaching the adhesive films 21a on the temporary base 11 onto the pressure-sensitive adhesive layer 22 to move them onto the pressure-sensitive adhesive layer 22 and then attaching the support film 10 onto the adhesive films 21a on the pressure-sensitive adhesive layer 22, as shown by the embodiment in FIG. 4, the adhesive films 21a on the temporary base 11 may be attached to the support film 10 to move them onto the support film 10, and then the pressure-sensitive adhesive layer 22 attached to the adhesive films 21a on the support film 10.

The pressure-sensitive adhesive layer 22 is supplied in the form of a dicing film 9 comprising a base film 12 and pressure-sensitive adhesive layer 22. The pressure-sensitive adhesive layer 22 may be appropriately selected from among those commonly used as film-like pressure-sensitive adhesives for dicing. The long dicing film 9 wound out from the supply roll travels around the peripheral surface of the roll 66. A roll 65 is situated opposite the roll 66, and the roll 66 is set so as to be movable along the direction of the arrow B. The temporary base 11 on which the adhesive layer 21a has been placed travels around the peripheral surface of the roll 65, and when the adhesive film 21a has reached the point between the rolls 65,66, the roll 66 presses against the roll 65. This causes the adhesive film 21a to be transferred to the pressure-sensitive adhesive layer 22. After the adhesive film 21a has passed between the rolls 65,66, the roll 66 moves along the direction of the arrow B so that it separates from the roll 65 and waits at a prescribed location until the next adhesive film 21a arrives. The temporary base 11 released from the adhesive films 21a is ejected via the peripheral surface of the roll 65.

An inspecting device 80 such as a CCD camera capable of detecting the outer appearance of the adhesive films 21a is situated upstream from the rolls 65,66, and the outer appearance of the adhesive films 21a is inspected at the inspecting device 80. When an adhesive film 21a judged as unacceptable by inspection passes between the rolls 65,66, the roll 66 maintains its position distant from the roll 65, and the unneeded adhesive film 21a is ejected together with the temporary base 11 without being transferred to the pressure-sensitive adhesive layer 22. In other words, the only adhesive films 21a on the temporary base 11 that are moved onto the support film 10 are those which are judged to be satisfactory by the step of inspecting the outer appearance of the adhesive films 21a. The acceptability of the adhesive films 21a is judged based on a predetermined standard, according to the desired product specifications. This will allow a multilayer film 1 to be obtained that contains essentially no defective adhesive films 21a.

The support film 10 supplied around the peripheral surface of the roll 68 is attached to the adhesive films 21a which have been laminated with the pressure-sensitive adhesive layer 22. The roll 68 contact bonds the support film 10 to the pressure-sensitive adhesive layer 22. Next, as shown in FIG. 5, a cutter 32 having a ring-shaped blade is used to cut the pressure-sensitive adhesive layer 22 and base film 12 along the shape of the ring-shaped exposed section 90. Portions 22c of the ring-shaped pressure-sensitive adhesive layer and portions 12c of the base film are removed via the peripheral surface of the roll 69, thus forming the pressure-sensitive adhesive films 22a. These steps yield a multilayer film 1 as illustrated in FIGS. 1 and 2.

The support film 10 is preferably a resin film such as a polyethylene terephthalate film. When an adhesive film is formed on the support film via a step of coating an adhesive solution onto a support film, it is generally difficult to ensure sufficient releasability of the adhesive film from the support film. With insufficient releasability, the adhesive film and pressure-sensitive adhesive film may peel when the laminated body comprising the adhesive film is released from the support film. Therefore, the surface of the support film must usually be release-treated. This creates a problem, however, in that when the layer of the release agent such as a silicone-based release agent is formed on the surface of the adhesive film side of the support film, the release agent is transferred onto the surface of the part of the overhanging section of the pressure-sensitive adhesive film that contacts the support film, potentially reducing the pressure-sensitive adhesive force of the overhanging section. In addition, the properties of the adhesive film may be impaired by inclusion of the release agent, or the semiconductor element may become fouled by the release agent.

Instead, according to this embodiment the adhesive films 21a formed on the temporary base 11 are transferred to the support film 10 without coating the adhesive solution onto the support film 10, and therefore the adhesive films 21a are satisfactorily releasable from the support film 10 even without subjecting the surface of the adhesive film 21a side of the support film 10 to release treatment. According to this embodiment, therefore, it is possible to employ a support film 10 with essentially no release agent on the surfaces of the adhesive films 21a, yet while maintaining sufficient releasability of the adhesive films 21a from the support film 10. Since release treatment of the support film 10 is not necessary, this embodiment can avoid the problem described above. Moreover, since the adhesive film 10 can be removed and reattached even with some strength of adhesiveness between the adhesive film 10 and temporary base 11, release treatment of the temporary base 11 will not be necessary in all cases.

When the adhesive film is formed on the support film by a step of coating an adhesive solution on the support film, portions of the adhesive layer may remain on the support film around the adhesive film remaining on the support film. Adhesive layer remnants will tend to remain, particularly when the support film is not release-treated. The remaining adhesive may be transferred onto the overhanging section of the pressure-sensitive adhesive film, potentially lowering the adhesive property of the overhanging section. This problem is also solved by this embodiment.

Furthermore, when the adhesive film is formed on the support film by a step of coating an adhesive solution on the support film, it is necessary to cut the adhesive film on the support film, and therefore cuts will tend to be created in the support film surface during cutting of the adhesive film. The presence of such cuts can leave extraneous material such as film dust on the support film surface around the adhesive film. This embodiment of the invention can minimize such cuts and extraneous material.

Figure 6:
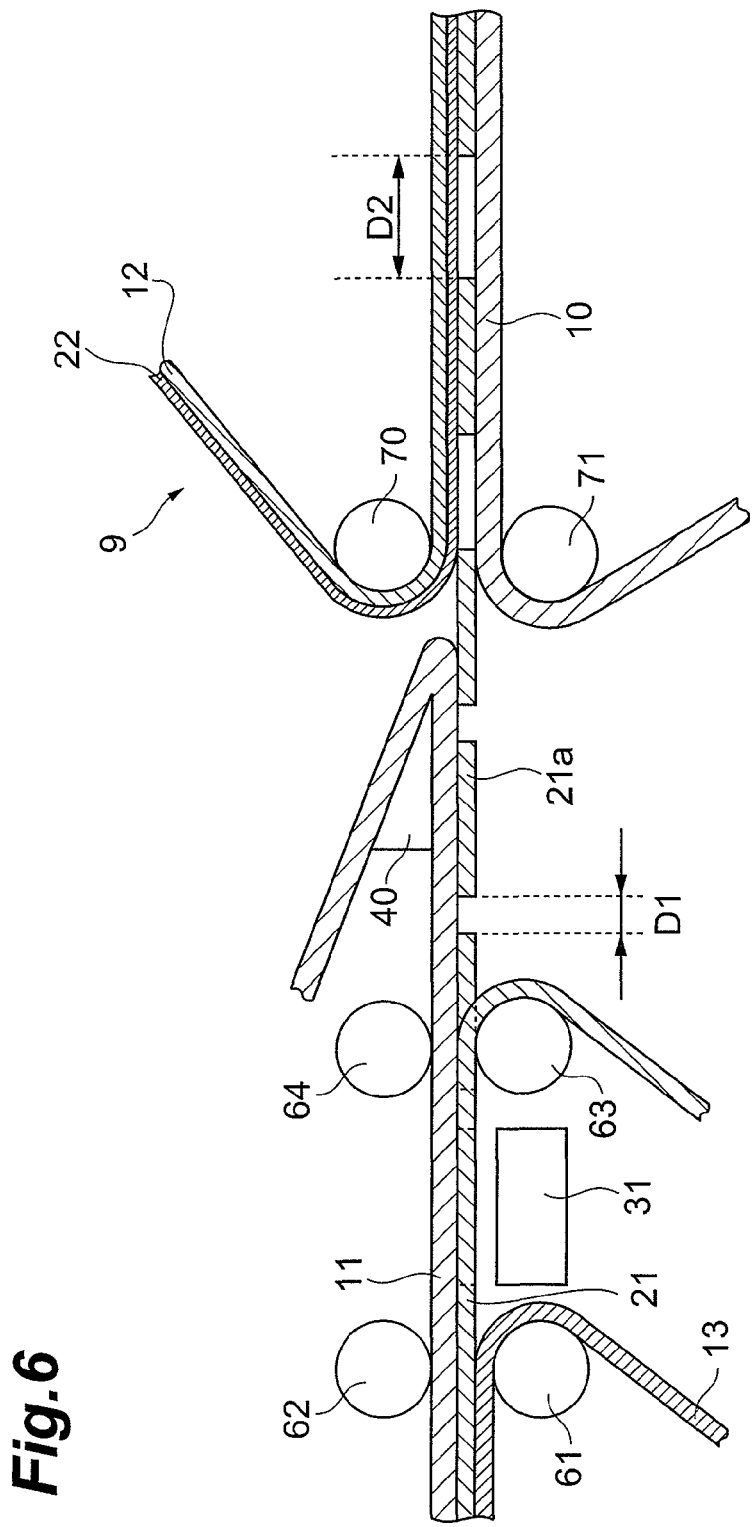
FIG. 6 is a schematic drawing showing an embodiment of a process for production of a multilayer film.
Figure 7:
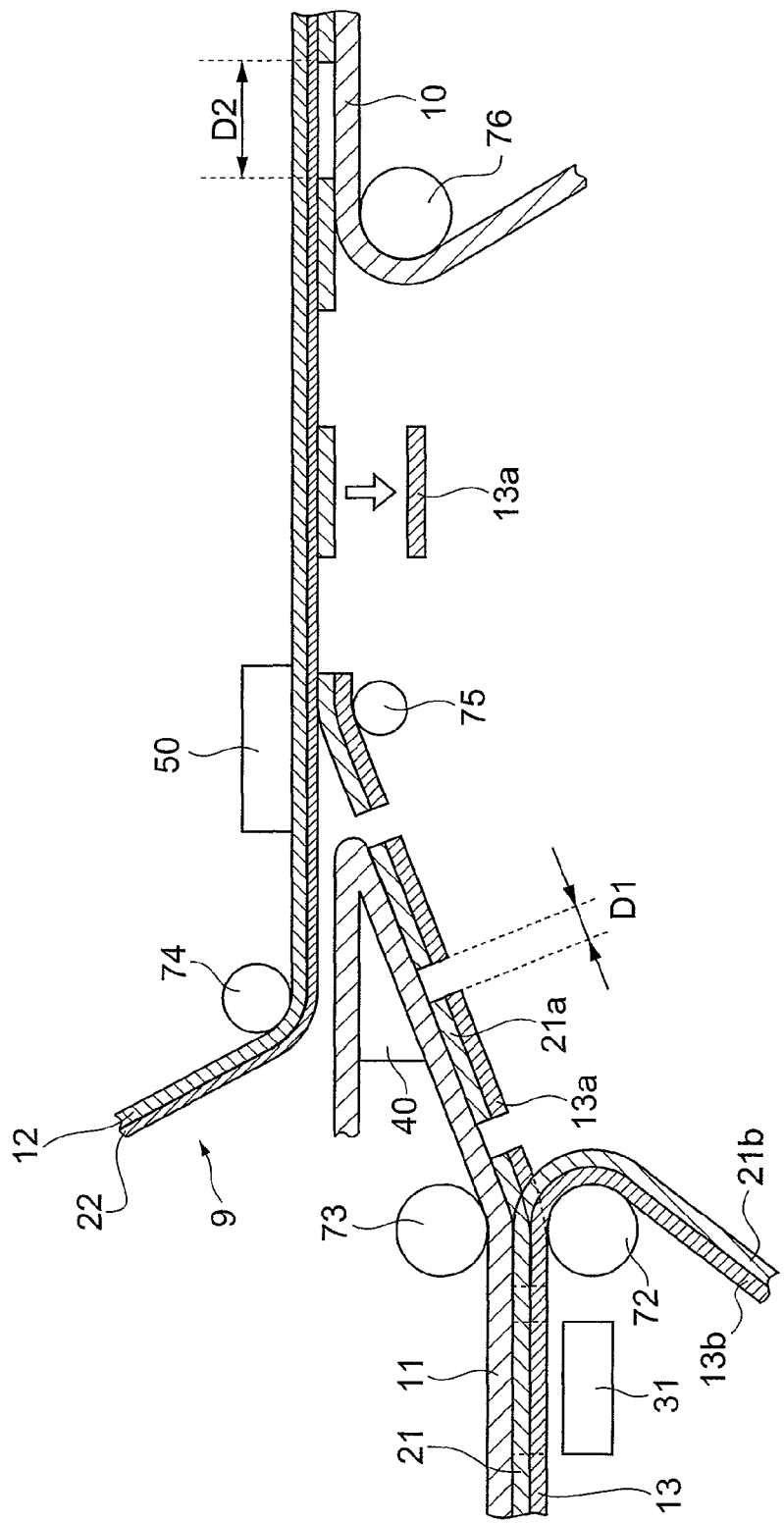
FIG. 7 is a schematic drawing showing an embodiment of a process for production of a multilayer film.
Figure 8:
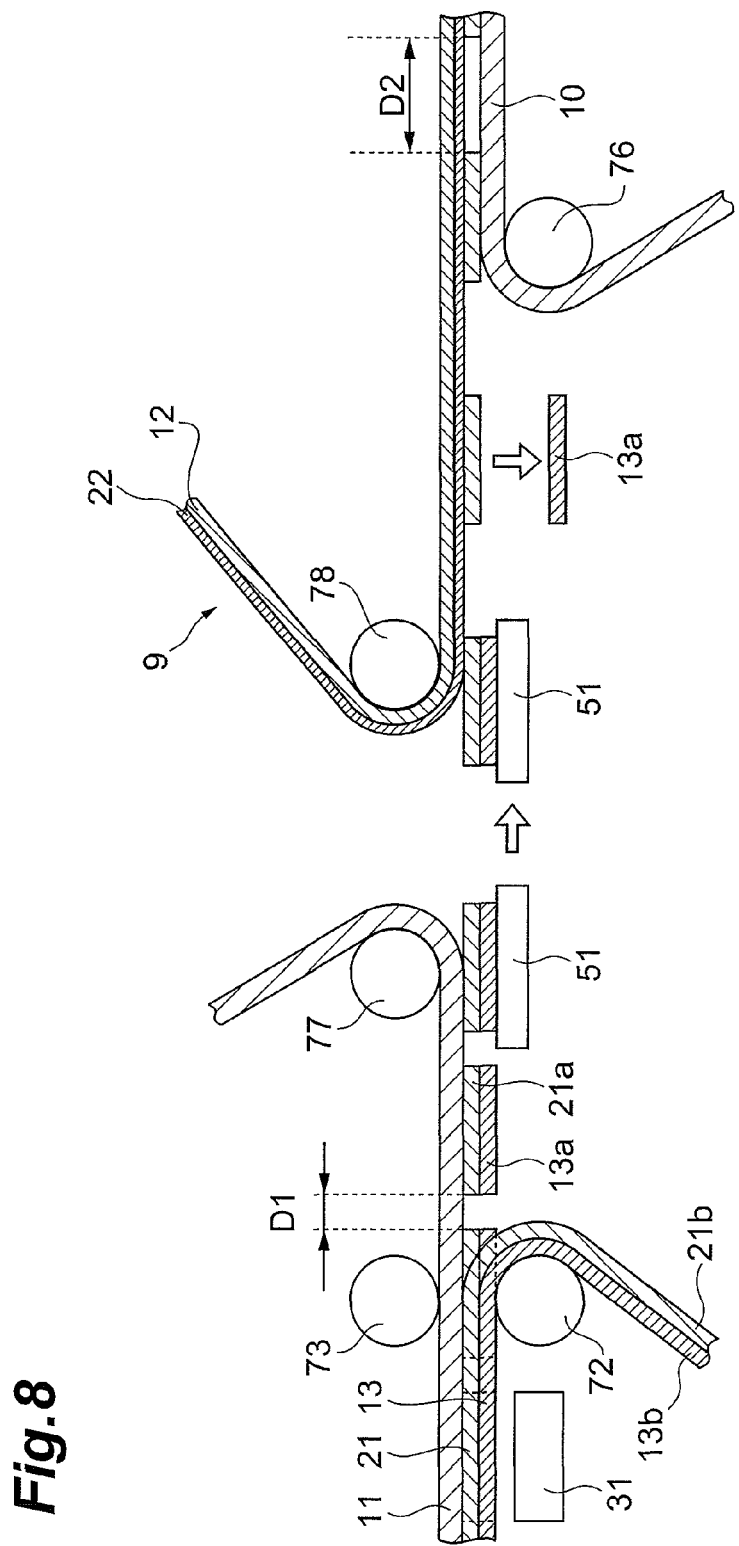
FIG. 8 is a schematic drawing showing an embodiment of a process for production of a multilayer film.

FIGS. 6, 7 and 8 are schematic drawings for another embodiment of a process for production of the multilayer film 1. In the embodiment shown in FIG. 6, the temporary base 11 is removed by pulling the acute angle section of a release sheet 40 having a cross-section with an acute angle shape, instead of with the roll 63 shown in FIG. 4. The adhesive films 21a are inserted between a pair of mutually opposing rolls 70,71 while the temporary base 11 is removed. A dicing film 9 is supplied around the peripheral surface of the roll 70 while the support film 10 is supplied around the peripheral surface of the roll 71. The adhesive films 21a are sandwiched between the pressure-sensitive adhesive layer 22 and support film 10 between the pair of rolls 70,71.

In the embodiment shown in FIG. 7, a cutter 31 is used to cut the adhesive layer 21 on the temporary base 11 into circles together with cover films 13. The adhesive films 21a and the cover films 13a on the adhesive films 21a remain, so that portions 21b of the adhesive layer and portions of the cover films 13b, as the unneeded portions, are removed around the peripheral surface of the roll 72. Next, the temporary base 11 is removed by pulling the acute angle section of the release sheet 40 having a cross-section with an acute angle shape. Together with removal of the temporary base 11, the adhesive films 21a and cover films 13a become attached to the pressure-sensitive adhesive layer 22 of the dicing film 9 that is supplied via the roll 74. Downstream from the release sheet 40 there is provided an adsorption pad 50 at a location on the side of the dicing film 9 opposite the adhesive films 21a, and the action of the adsorption pad 50 causes the dicing film 9 to be adsorbed onto the adsorption pad 50. The adsorption pad 50 attracts the dicing film 9 by the force of static electricity, vacuum pressure or the like. The adhesive films 21a are contact bonded by the roll 75 onto the dicing film 9 which has been adsorbed onto the adsorption pad 50. The cover films 13a are then removed, and the support film 10 is laminated onto the exposed adhesive films 21a by a roll 76.

In the embodiment shown in FIG. 8, a roll 77 releases the temporary base 11 from the laminated body comprising the adhesive films 21*a* and cover films 13*a*. The laminated body is adsorbed onto an adsorption pad 51 standing by on the side of the laminated body opposite the temporary base 11, at the position where the temporary base 11 is to be released. The adsorption pad 51 bearing the laminated body comprising the adhesive films 21*a* and cover films 13*a* is transported downstream, and the adhesive films 21*a* are attached to the pressure-sensitive adhesive layer 22 of the dicing film 9 that is supplied by the roll 78. The cover films 13*a* are then removed, and the support film 10 is laminated onto the exposed adhesive films 21*a* by the roll 76.

The steps illustrated by FIGS. 6 to 8 result in formation of a pressure-sensitive adhesive film 22*a* in the same manner as the embodiment of FIG. 5.

The present invention is not limited to the embodiments described above, and it may incorporate appropriate modifications that still fall within the gist of the invention. For example, the width of the temporary base may be smaller than the width of the support film. This can reduce the amount of unneeded portions of the adhesive layer in the widthwise direction. Also, the process is not particularly restricted so long as it is a continuous process in which the adhesive film is moved from the temporary base onto the support film and a pressure-sensitive adhesive film is formed on the adhesive film, and the order of attachment or reattachment of each of the constituent members may be modified as appropriate.

INDUSTRIAL APPLICABILITY

By producing a multilayer film having a plurality of adhesive films formed on a support film according to the invention, it is possible to efficiently form the plurality of adhesive films with any desired predetermined spacing that is different from the spacing in the final product, or without spacing. As a result, reduced waste and lower production cost are achieved since the amount of adhesive layer to be removed as unneeded sections can be minimized. Also according to the invention, it is possible to avoid cuts in the support film surface and prevent residue of contaminants such as film dust caused as a result.

The invention claimed is:

1. A process for production of a multilayer film that comprises a support film and a plurality of adhesive films situated on the support film along a lengthwise direction of the support film, the process comprising
    a step (A) of cutting an adhesive layer formed to cover an entirety of one side of a temporary base in such a manner as to partition a plurality of sections to serve as adhesive films from other sections of the adhesive layer, the plurality of sections being situated along a lengthwise direction of the temporary base either at a prescribed spacing or without spacing, wherein first contact surfaces of the adhesive films contact the temporary base, and
    a step (B) of moving the adhesive films on the temporary base onto the support film at a prescribed spacing along the lengthwise direction of the support film,
    wherein when the plurality of sections which are to serve as adhesive films are situated at the prescribed spacing along the lengthwise direction of the temporary base, the spacing between the adjacent adhesive films on the temporary base is narrower than the spacing between the adjacent adhesive films on the support film, second contact surfaces of the adhesive films contact the support film, and the second contact surfaces are on opposite sides of the adhesive films from the first contact surfaces,
    wherein the multilayer film further comprises pressure-sensitive adhesive films with overhanging sections provided on the adhesive films, which overhang from outer peripheries of the adhesive films,
    and wherein the production process further comprises
    a step (a) of attaching the adhesive films and a pressure-sensitive adhesive layer, wherein the pressure-sensitive adhesive layer contacts the first contact surfaces of the adhesive films,
    a step (b) of cutting the pressure-sensitive adhesive layer on the adhesive films so as to partition a plurality of sections which are to serve as pressure-sensitive adhesive films from other sections of the pressure-sensitive adhesive layer, and
    a step (c) of removing all or some sections of the other sections of the pressure-sensitive adhesive layer, leaving the pressure-sensitive adhesive films on the adhesive films, and
    wherein the adhesive films are die bonding adhesive films and the pressure-sensitive adhesive films are dicing pressure-sensitive adhesive films.

2. A production process according to claim 1, which further comprises a step (C) of removing all or some of the other sections of the adhesive layer on the temporary base to leave the adhesive films on the temporary base, as a step between step (A) and step (B).

3. A production process according to claim 1, wherein the support film is essentially free of cuts around an outer periphery of the adhesive films.

4. A production process according to claim 1, wherein in step (a), the adhesive films and the pressure-sensitive adhesive layer are attached to move the plurality of adhesive films on the temporary base onto the pressure-sensitive adhesive layer at a prescribed spacing that is different from the spacing between the adjacent adhesive films on the temporary base, along the lengthwise direction of the pressure-sensitive adhesive layer,
    step (B) comprises, in order,
    step (a), and
    a step (d) of attaching the adhesive films on the pressure-sensitive adhesive layer to the support film to move the adhesive films onto the support film at a prescribed spacing along the lengthwise direction of the support film with the plurality of adhesive films still attached to the pressure-sensitive adhesive layer,
    and the production process comprises steps (b) and (c) after step (B).

5. A production process according to claim 1, which comprises steps (a), (b) and (c) after step (B),
    and wherein in step (a), the adhesive films that have been moved onto the support film in step (B) are attached to the pressure-sensitive adhesive layer while still attached to the support film.

6. A production process according to claim 1, wherein step (b) further includes cutting both a base film substrate carrying the pressure-sensitive adhesive layer and the pressure-sensitive adhesive layer so as to partition the plurality of sections that are to serve as the pressure-sensitive adhesive films and base films covering each of the pressure-sensitive adhesive films from the other sections of the pressure-sensitive adhesive layer and other sections of the base film substrate, and
    step (c) further includes removing both the other sections of the pressure-sensitive adhesive layer surrounding the plurality of pressure-sensitive adhesive films and the other sections of the base film substrate.

7. A production process according to any one of claims 2, 3, and 4-1, which further comprises a step of inspecting the outer appearance of the adhesive films on the temporary base.

8. A production process according to claim 7, wherein the only adhesive films on the temporary base that are moved onto the support film are those which are judged to be satisfactory by the step of inspecting the outer appearance of the adhesive films.

9. A process for production of a multilayer film that comprises a support film and a plurality of adhesive films situated on the support film along a lengthwise direction of the support film, the process comprising
- a step (A) of cutting an adhesive layer formed to cover an entirety of one side of a temporary base in such a manner as to partition a plurality of sections to serve as adhesive films from other sections of the adhesive layer, the plurality of sections being situated along a lengthwise direction of the temporary base either at a prescribed spacing or without spacing, wherein first contact surfaces on the adhesive films are in contact with the temporary base, and
- a step (B) of moving the adhesive films on the temporary base onto the support film at a prescribed spacing along the lengthwise direction of the support film, wherein second contact surfaces of the adhesive films are in contact with the support film, wherein when the plurality of sections which are to serve as adhesive films are situated at the prescribed spacing along the lengthwise direction of the temporary base, the spacing between the adjacent adhesive films on the temporary base is different from the spacing between the adjacent adhesive films on the support film and the support film is essentially free of cuts around an outer periphery of the adhesive films.

* * * * *